| (12) | United States Patent | (10) Patent No.: US 10,333,274 B2 |
|---|---|---|
| | Shimizu | (45) Date of Patent: Jun. 25, 2019 |

(54) LASER LIGHT SOURCE DEVICE

(71) Applicant: USHIO DENKI KABUSHIKI KAISHA, Tokyo (JP)

(72) Inventor: Akihiro Shimizu, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/085,516

(22) PCT Filed: Mar. 8, 2017

(86) PCT No.: PCT/JP2017/009222
§ 371 (c)(1),
(2) Date: Sep. 14, 2018

(87) PCT Pub. No.: WO2017/159492
PCT Pub. Date: Sep. 21, 2017

(65) Prior Publication Data
US 2019/0097390 A1    Mar. 28, 2019

(30) Foreign Application Priority Data

Mar. 16, 2016 (JP) ................................. 2016-052636

(51) Int. Cl.
*H01S 5/06* (2006.01)
*H01S 5/068* (2006.01)
*H01S 5/024* (2006.01)

(52) U.S. Cl.
CPC ...... *H01S 5/06804* (2013.01); *H01S 5/02415* (2013.01); *H01S 5/0612* (2013.01)

(58) Field of Classification Search
CPC ........................ H01S 5/06804; H01S 5/02415; H01S 5/0612
See application file for complete search history.

(56) References Cited

U.S. PATENT DOCUMENTS

2016/0329681 A1* 11/2016 Tulip .................. H01S 5/02415

FOREIGN PATENT DOCUMENTS

JP    2011-108930 A    6/2011

OTHER PUBLICATIONS

International Search Report issued in PCT/JP2017/009222; dated Apr. 25, 2017.
Notification of Transmittal of Translation of the International Preliminary Report on Patentability and Translation of Written Opinion of the International Searching Authority; PCT/JP2017/009222; dated Sep. 27, 2018.

* cited by examiner

*Primary Examiner* — Armando Rodriguez
(74) *Attorney, Agent, or Firm* — Studebaker & Brackett PC

(57) ABSTRACT

A laser light source device has a light source unit including a semiconductor laser element that emits laser light having a predetermined wavelength band at a temperature from an allowable lower limit temperature to an allowable upper limit temperature, a cooler, an element temperature measurement section, a cooler temperature measurement section, and a controller that controls the cooler. The controller controls the cooler such that the cooler temperature approaches a set temperature. The controller lowers the set temperature as long as the element temperature exceeds the allowable upper limit temperature, and the controller increases the set temperature as long as the element temperature falls below the allowable lower limit temperature.

16 Claims, 4 Drawing Sheets

(a)

(b)

| Allowable upper limit temperature | 25°C |
|---|---|
| Allowable lower limit temperature | 23°C |
| Set temperature | 22°C |
| Upper limit value | 25°C |
| Lower limit value | 15°C |

(a)

(b)

| Set temperature | 22°C |
|---|---|

LASER LIGHT SOURCE DEVICE

TECHNICAL FIELD

The present invention relates to a laser light source device.

BACKGROUND ART

It is known that the wavelength of laser light emitted from a semiconductor laser element depends on the temperature of the semiconductor laser element. As an example, in a lighting apparatus having a semiconductor laser element, there is a problem that if the wavelength of the laser light changes, the color of the laser light changes. Thus, in order to suppress a variation of the wavelength of the laser light, it is required to maintain the temperature of the semiconductor laser element within a desired range.

From such a viewpoint, the laser light source device of Patent Document 1 includes a cooler that cools a semiconductor laser element, and controls the cooler such that the temperature of the semiconductor laser element reaches a preset temperature. More specifically, in the laser light source device of Patent Document 1, the element temperature of the semiconductor laser element is measured, and when the element temperature is higher than the preset temperature, a current value flowing through the cooler is increased, and when the element temperature is lower than the preset temperature, the current value flowing through the cooler is decreased.

PRIOR ART DOCUMENT

Patent Document

Patent Document 1: JP-A-2011-108930

SUMMARY OF THE INVENTION

Problems to be Solved by the Invention

However, the technique of Patent Document 1 has the following problems. That is, since a medium such as a heat sink exists between the semiconductor laser element and the cooler, it takes time to conduct the heat generated from the semiconductor laser element, to the cooler. Thus, there is a problem that the temperature of the semiconductor laser element cannot be controlled with high accuracy (more specifically, the temperature of the semiconductor laser element fluctuates greatly) due to a time lag caused by heat conduction.

Here, in order to suppress occurrence of the time lag, it is conceivable to measure the temperature of the cooler rather than measure the temperature of the semiconductor laser element, and to control the temperature of the cooler.

However, as a result of intensive studies made by the present inventor, it has been found that when the temperature of a cooler is measured and controlled, there occurs such a phenomenon that the temperature of a semiconductor laser element is stabilized at a higher or lower temperature than a desired temperature. Thus, it is desired to realize a technology capable of stabilizing the temperature of the semiconductor laser element within a desired range with higher accuracy.

It is therefore an object of the present invention to provide a laser light source device capable of stabilizing the temperature of a semiconductor laser element within a desired range with higher accuracy.

Means for Solving the Problem

A laser light source device of the present invention has:
a light source unit including a semiconductor laser element that emits laser light having a predetermined wavelength band at a temperature from an allowable lower limit temperature to an allowable upper limit temperature;
a cooler connected to the light source unit;
an element temperature measurement section that measures an element temperature which is a temperature of the semiconductor laser element;
a cooler temperature measurement section that measures a cooler temperature which is a temperature of the cooler and is a temperature at a position away from the element temperature; and
a controller that controls the cooler,
wherein the controller
controls the cooler such that the cooler temperature approaches a set temperature,
lowers the set temperature when the element temperature exceeds the allowable upper limit temperature, and
increases the set temperature when the element temperature falls below the allowable lower limit temperature.

According to the above configuration, the controller controls the cooler such that the cooler temperature approaches the set temperature. That is, the controller is configured to control the temperature at a place close to the cooler as compared with the semiconductor laser element. Consequently, when a medium such as a heat sink exists between the semiconductor laser element and the cooler, an influence of the medium can be suppressed. That is, according to the above configuration, a highly accurate control can be realized as compared with the case of measuring element temperature of the semiconductor laser element and controlling the element temperature.

Further, according to the above configuration, the set temperature of the cooler temperature is adjusted according to the temperature of the semiconductor laser element. This makes it possible to stabilize the temperature of the semiconductor laser element within a desired range while controlling the temperature of the cooler.

The controller may lower the set temperature when the element temperature exceeds the allowable upper limit temperature for a certain time, and may maintain the set temperature when the element temperature does not exceed the allowable upper limit temperature for a certain time.

The controller may increase the set temperature when the element temperature falls below the allowable lower limit temperature for a certain time, and may maintain the set temperature when the element temperature does not fall below the allowable lower limit temperature for a certain time.

According to the above configuration, the set temperature of the cooler temperature is changed only when a state in which the element temperature exceeds an allowable upper limit temperature or a state in which the element temperature falls below an allowable lower limit temperature continues for a certain time. Thus, even when the element temperature of the semiconductor laser element fluctuates greatly, the set temperature of the cooler temperature can be suitably set.

In the case where the element temperature exceeds the allowable upper limit temperature, when the set temperature exceeds a lower limit, the controller may lower the set temperature, and when the set temperature does not exceed the lower limit, the controller may maintain the set temperature.

According to the above configuration, the set temperature of the cooler temperature is not set to a value below the lower limit but set to be equal to or higher than the lower limit. Consequently, since the cooler temperature can be prevented from reaching extremely low temperatures, it is possible to suppress dirt such as rust and short circuit due to condensation on the cooler.

In the case where the element temperature falls below the allowable lower limit temperature, when the set temperature falls below an upper limit, the controller may increase the set temperature, and when the set temperature does not fall below the upper limit, the controller may maintain the set temperature.

According to the above configuration, the set temperature of the cooler temperature is not set to a value exceeding the upper limit but set to be equal to or lower than the upper limit. Consequently, the element temperature of the semiconductor laser element can be prevented from reaching extremely high temperatures, and it is possible to suppress shortening of the life of the semiconductor laser element.

The controller may have:

a storage that stores the allowable upper limit temperature and the allowable lower limit temperature, a set temperature determination section that compares the element temperature measured by the element temperature measurement section, with at least one of the allowable upper limit temperature and the allowable lower limit temperature to determine the set temperature; and a current value determination section that determines a current value to be supplied to the cooler based on a difference between the determined set temperature and the cooler temperature measured by the cooler temperature measurement section, and the cooler may cool the light source unit according to current with the current value.

Effect of the Invention

The laser light source device of the present invention can stabilize the temperature of the semiconductor laser element within a desired range with higher accuracy.

MODE FOR CARRYING OUT THE INVENTION

A laser light source device of the present embodiment will be described with reference to the drawings. In each drawing, the dimensional ratio of the drawings does not necessarily coincide with the actual dimensional ratio.

Embodiments

[Configuration]

Figure 1:
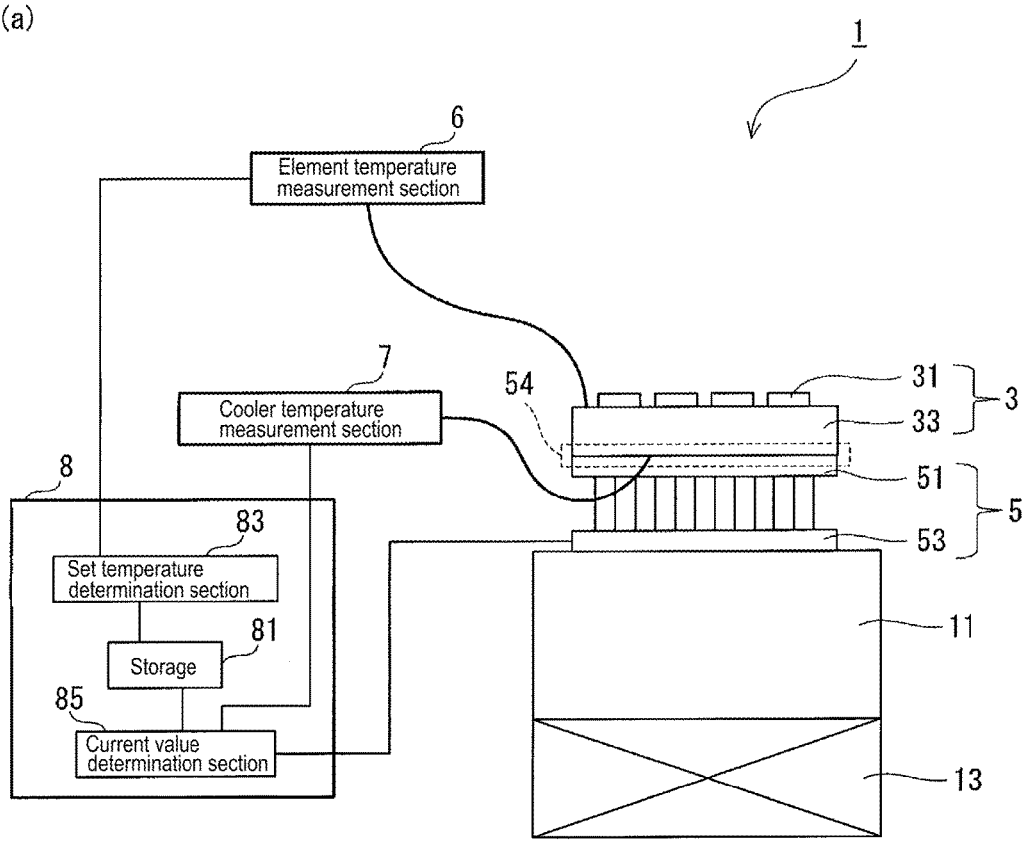
FIG. 1 is a diagram schematically showing a configuration of a laser light source device of an embodiment.

Hereinafter, a configuration of a laser light source device 1 according to the embodiment will be described with reference to FIG. 1. As shown in FIG. 1(a), the laser light source device 1 includes a light source unit 3, a Peltier element 5, an element temperature measurement section 6, a cooler temperature measurement section 7, a controller 8, a heat sink 11, and a fan 13.

The light source unit 3 includes a semiconductor laser element 31 that emits laser light and a heat transfer portion 33. As an example, when the temperature of the semiconductor laser element 31 is 23 to 25° C., the semiconductor laser element 31 emits blue laser light having a wavelength of 380 to 500 nm. The heat transfer portion 33 has thermal conductivity and is connected to the semiconductor laser element 31. The heat transfer portion 33 conducts heat generated from the semiconductor laser element 31, to the Peltier element 5. The heat transfer portion 33 is connected to the Peltier element 5 via a well-known heat dissipation sheet or heat dissipation grease (not shown) so that heat can be efficiently conducted to the Peltier element 5. The heat transfer portion 33 is formed of a metal, such as aluminum, for example.

The Peltier element 5 is connected to the heat transfer portion 33. The Peltier element 5 includes a heat absorbing portion 51 that absorbs heat conducted from the semiconductor laser element 31 to the heat transfer portion 33, and a heat dissipating portion 53 that dissipates the heat absorbed by the heat absorbing portion 51, to the heat sink 11. The heat absorbing portion 51 includes a heat absorbing surface 54 connected to the heat transfer portion 33. The heat dissipating portion 53 is connected to the heat sink 11 via a well-known heat dissipation sheet or heat dissipation grease (not shown) so that heat can be efficiently dissipated to the heat sink 11.

When current flows through the Peltier element 5, the heat absorbing portion 51 absorbs heat from the heat transfer portion 33, and the heat dissipating portion 53 dissipates the heat absorbed by the heat absorbing portion 51, to the heat sink 11. That is, heat is transferred from the heat absorbing portion 51 to the heat dissipating portion 53. As described above, the Peltier element 5 is an element capable of cooling the light source unit 3 by supply of current. When the voltage applied to the Peltier element 5 is increased, the current supplied to the Peltier element 5 increases, and the amount of heat absorbed by the heat absorbing portion 51 also increases. As a result, the amount of heat transferred from the heat absorbing portion 51 to the heat dissipating portion 53 also increases. The Peltier element 5 corresponds to the "cooler".

The element temperature measurement section 6 measures the temperature of the semiconductor laser element 31 (hereinafter sometimes referred to as "element temperature"). In the present embodiment, the element temperature measurement section 6 measures the temperature of the heat transfer portion 33 as the element temperature. The heat transfer portion 33 is connected to the semiconductor laser element 31 and has a temperature equivalent to the temperature of the semiconductor laser element 31. The element temperature measurement section 6 is constituted by a well-known temperature sensor such as a thermistor or a thermocouple.

The cooler temperature measurement section 7 measures the temperature of the Peltier element 5 (hereinafter sometimes referred to as "cooler temperature"). In the present embodiment, the cooler temperature measurement section 7 measures the temperature of the heat absorbing surface 54 in the heat absorbing portion 51 as the cooler temperature. The temperature of the heat absorbing surface 54 is a temperature away from the element temperature of the semiconductor laser element 31 and changes in conjunction with the element temperature. For example, if the temperature of the semiconductor laser element 31 rises, the temperature of the heat absorbing surface 54 also gradually rises. On the other hand, if the temperature of the semiconductor laser element 31 decreases, the temperature of the heat absorbing surface 54 also gradually decreases. The cooler temperature measurement section 7 is constituted by a well-known temperature sensor such as a thermistor or a thermocouple.

The controller 8 includes a storage 81, a set temperature determination section 83, and a current value determination section 85. The storage 81 is constituted by memories such as ROM and RAM, and the set temperature determination section 83 and the current value determination section 85 are constituted by a CPU.

As shown in FIG. 1(b), the storage 81 stores an allowable upper limit temperature, an allowable lower limit temperature, a set temperature, an upper limit value, and a lower limit value. In FIG. 1(b), as an example, when the semiconductor laser element 31 emits blue laser light having a wavelength of 380 to 500 nm, the allowable upper limit temperature, the allowable lower limit temperature, the set temperature, the upper limit value, and the lower limit value stored in the storage 81 are shown.

The allowable upper limit temperature is the maximum allowable temperature of the semiconductor laser element 31. The allowable lower limit temperature is the minimum allowable temperature of the semiconductor laser element 31. When the temperature of the semiconductor laser element 31 is in the range from the allowable lower limit temperature to the allowable upper limit temperature (that is, 23 to 25° C.), the output wavelength of the semiconductor laser element 31 falls within a desired range (that is, 380 to 500 nm), and color (that is, blue) of the laser light is stabilized.

The set temperature is a temperature to which the temperature of the Peltier element 5 (that is, the cooler temperature) should be matched. Although details will be described later, the controller 8 drives the Peltier element 5 such that the cooler temperature approaches the set temperature.

The upper limit value is the upper limit value of the set temperature, and the lower limit value is the lower limit value of the set temperature. Although details will be described later, the set temperature is set to a value not less than the lower limit value and not more than the upper limit value by the controller 8. The set temperature is set to an arbitrary value (for example, 22° C.) that is not less than the lower limit value and not more than the upper limit value in an initial state (that is, a state at the time of shipment of the laser light source device 1).

The set temperature determination section 83 determines the set temperature to be stored in the storage 81. Specifically, the set temperature determination section 83 acquires the element temperature from the element temperature measurement section 6, reads the allowable upper limit temperature, the allowable lower limit temperature, the set temperature, the upper limit value, and the lower limit value from the storage 81, and updates/maintains the set temperature. Details of the set temperature determination section 83 will be described later.

The current value determination section 85 determines a current value to be supplied to the Peltier element 5 and supplies current with the current value to the Peltier element 5. Specifically, the current value determination section 85 acquires the cooler temperature from the cooler temperature measurement section 7, reads the set temperature from the storage 81, and determines a current value based on the cooler temperature and the set temperature. Details of the current value determination section 85 will be described later.

The heat sink 11 includes fins (not shown) and conducts heat dissipated from the heat dissipating portion 53, to the fins. Warm air around the fin due to the heat conducted to the fin is discharged into the atmosphere by flow of air generated by the fan 13.

[Temperature Control Processing]

Figure 2:
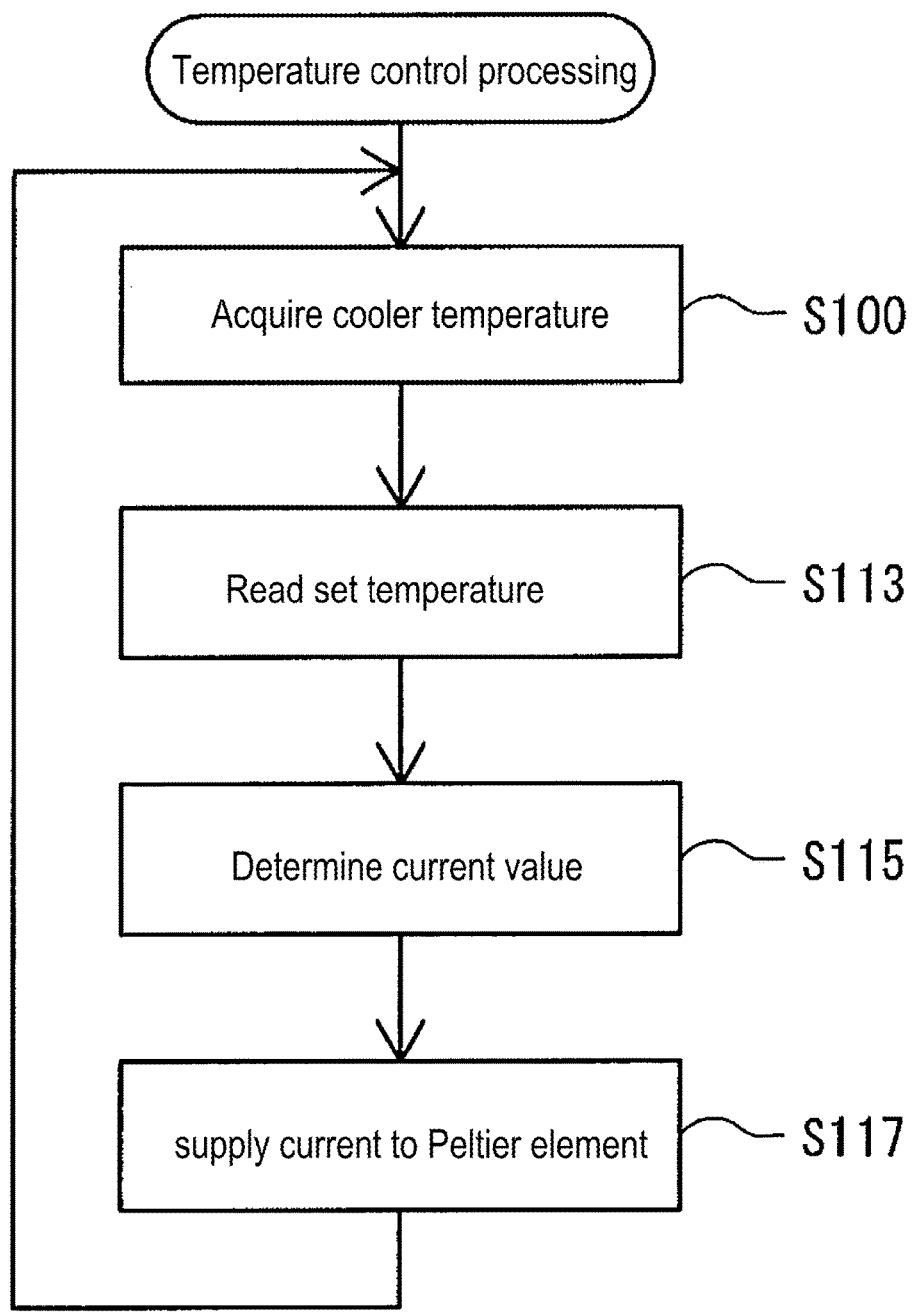
FIG. 2 is a flowchart showing temperature control processing in the laser light source device of the embodiment.

Next, the processing by the controller 8 will be described with reference to FIG. 2. FIG. 2 is a flowchart showing temperature control processing executed by the current value determination section 85 of the controller 8.

When an operation instruction for the laser light source device 1 is issued, the current value determination section 85 starts the temperature control processing in FIG. 2. The current value determination section 85 repeats the temperature control processing until a stop instruction for the laser light source device 1 is issued.

When the temperature control processing starts, the current value determination section 85 acquires the cooler temperature from the cooler temperature measurement section 7 (S100). Subsequently, the current value determination section 85 reads the set temperature set by processing in FIG. 3 described later, from the storage 81 (S113). Subsequently, the current value determination section 85 determines a current value to be supplied to the Peltier element 5 such that the cooler temperature approaches the set temperature (S115). Specifically, when the cooler temperature is higher than the set temperature, the current value determination section 85 increases the current value to be supplied to the Peltier element 5. On the other hand, when the cooler temperature is lower than the set temperature, the current value determination section 85 decreases the current value to be supplied to the Peltier element 5. The current value determination section 85 increases the increase/decrease amount of the current value as a difference between the cooler temperature and the set temperature increases.

Subsequently, the current value determination section 85 supplies current with the current value determined in S115 to the Peltier element 5 (S117) and returns to the processing in S100.

As described above, the current value determination section 85 drives the Peltier element 5 such that the temperature of the Peltier element 5 (that is, the cooler temperature) approaches the set temperature.

[Set Temperature Determination Processing]

Figure 3:
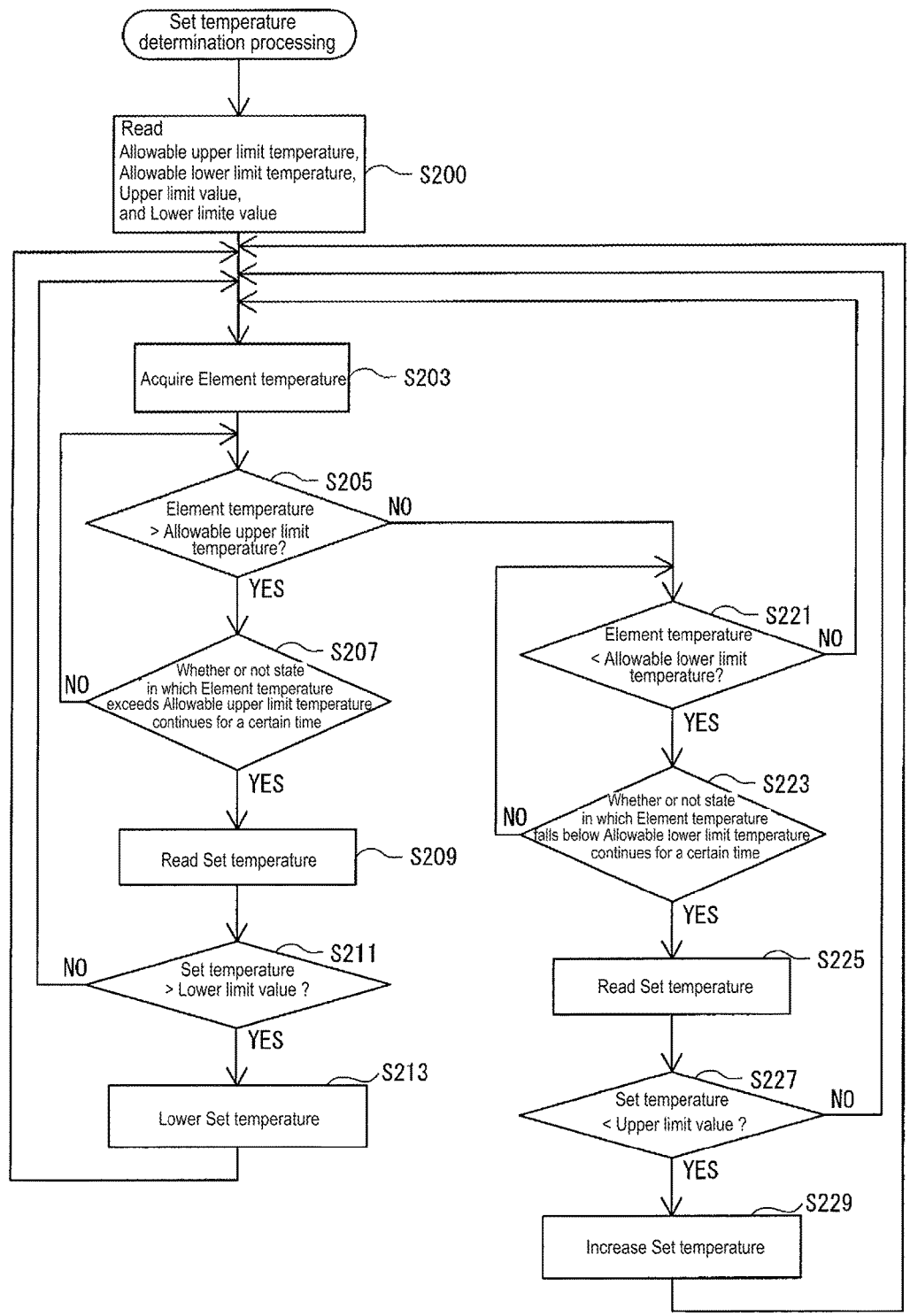
FIG. 3 is a flowchart showing set temperature determination processing in the laser light source device of the embodiment.

Next, set temperature determination processing will be described with reference to FIG. 3. FIG. 3 is a flowchart showing set temperature determination processing executed by the set temperature determination section 83 of the controller 8.

When an operation instruction for the laser light source device 1 is issued, the set temperature determination section 83 starts the set temperature determination processing in FIG. 3. The set temperature determination section 83 repeats the set temperature determination processing until a stop instruction for the laser light source device 1 is issued.

When the set temperature determination processing starts, the set temperature determination section 83 reads the allowable upper limit temperature, the allowable lower limit temperature, the upper limit value, and the lower limit value from the storage 81 (S200). Subsequently, the set temperature determination section 83 acquires the element temperature from the element temperature measurement section 6 (S203).

Subsequently, the set temperature determination section 83 determines whether the element temperature exceeds the allowable upper limit temperature (S205). When it is determined that the element temperature exceeds the allowable upper limit temperature (S205: YES), the processing proceeds to S207. When it is determined that the element temperature does not exceed the allowable upper limit temperature (S205: NO), the processing proceeds to S221. S221 will be described later.

When the processing proceeds to S207, the set temperature determination section 83 determines whether the state in which the element temperature exceeds the allowable upper limit temperature continues for a certain time (for example, 60 seconds) (S207). As an example, the controller 8 includes a timer (not shown), and every time the timer measures 1 second, the set temperature determination section 83 determines whether the element temperature exceeds the allowable upper limit temperature. When the element temperature falls below the allowable upper limit temperature before the timer measures 60 seconds, the set temperature determination section 83 terminates the timer measurement and returns to the processing in S205 (S207: NO). On the other hand, when the element temperature exceeds the allowable upper limit temperature until the timer measures 60 seconds, the processing proceeds to S209 (S207: YES). The time measured by the timer may be shorter than 60 seconds (for example, 30 seconds) or may be longer than 60 seconds (for example, 90 seconds).

When the processing proceeds to S209, the set temperature determination section 83 reads the set temperature set in the previous flow or set in the initial state, from the storage 81 (S209). Subsequently, the set temperature determination section 83 determines whether the set temperature exceeds the lower limit value (S211).

When it is determined that the set temperature exceeds the lower limit value (S211: YES), the set temperature determination section 83 lowers the set temperature and updates the set temperature in the storage 81 (S213). As an example, the set temperature determination section 83 changes the set temperature to a temperature lower by 1° C. The amount reduced by the set temperature determination section 83 in S213 may be larger or smaller than 1° C.

On the other hand, when it is determined that the set temperature does not exceed the lower limit value (S211: NO), the set temperature determination section 83 returns to the processing in S203 without performing S213. That is, the set temperature is not changed, and the current value is maintained.

When it is determined that the set temperature does not exceed the lower limit value in S211 (S211: NO), the set temperature matches the lower limit value.

Subsequently, the processing after S221 will be described. When it is determined that the element temperature does not exceed the allowable upper limit temperature in S205 (S205: NO), the set temperature determination section 83 determines whether the element temperature falls below the allowable lower limit temperature (S221). When it is determined that the element temperature falls below the allowable lower limit temperature (S221: YES), the processing proceeds to S223. When it is determined that the element temperature does not fall below the allowable lower limit temperature (S221: NO), the processing returns to S203.

When the processing proceeds to S223, the set temperature determination section 83 determines whether the state in which the element temperature falls below the allowable lower limit temperature continues for a certain time (for example, 60 seconds) (S223). The set temperature determination section 83 performs the processing in S223 using a timer (not shown) in the same manner as the processing in S207 described above. As an example, when the element temperature exceeds the allowable lower limit temperature before the timer measures 60 seconds, the processing returns to S221 (S223: NO). On the other hand, when the element temperature falls below the allowable lower limit temperature until the timer measures 60 seconds, the processing proceeds to S225 (S223: YES).

When the processing proceeds to S225, the set temperature determination section 83 reads the set temperature from the storage 81 (S225). Subsequently, the set temperature determination section 83 determines whether the set temperature falls below the upper limit value (S227).

When it is determined that the set temperature falls below the upper limit value (S227: YES), the set temperature determination section 83 increases the set temperature and updates the set temperature in the storage 81 (S229). As an example, the set temperature determination section 83 changes the set temperature to a temperature higher by 1° C. The amount increased by the set temperature determination section 83 in S229 may be larger or smaller than 1° C.

On the other hand, when it is determined that the set temperature does not fall below the upper limit value (S227: NO), the set temperature determination section 83 returns to the processing in S203 without performing S229. That is, the set temperature is not changed, and the current value is maintained.

When it is determined that the set temperature does not fall below the upper limit value in S227 (S227: NO), the set temperature matches the upper limit value.

As described above, the set temperature is determined by the set temperature determination section 83 based on the element temperature of the semiconductor laser element 31.

REFERENCE EXAMPLE

Subsequently, in order to explain operational effects of the laser light source device 1 of the present embodiment, a configuration of the laser light source device of a reference example and phenomena occurred in the laser light source device of the reference example will be described.

As described in the section "PROBLEMS TO BE SOLVED BY THE INVENTION", in the conventional technique of measuring the temperature of the semiconductor laser element 31 and driving the Peltier element 5 such that the temperature of the semiconductor laser element 31 reaches a predetermined temperature, there has been a problem that highly accurate temperature control cannot be performed (that is, the temperature of the semiconductor laser element 31 fluctuates greatly).

Figure 4:
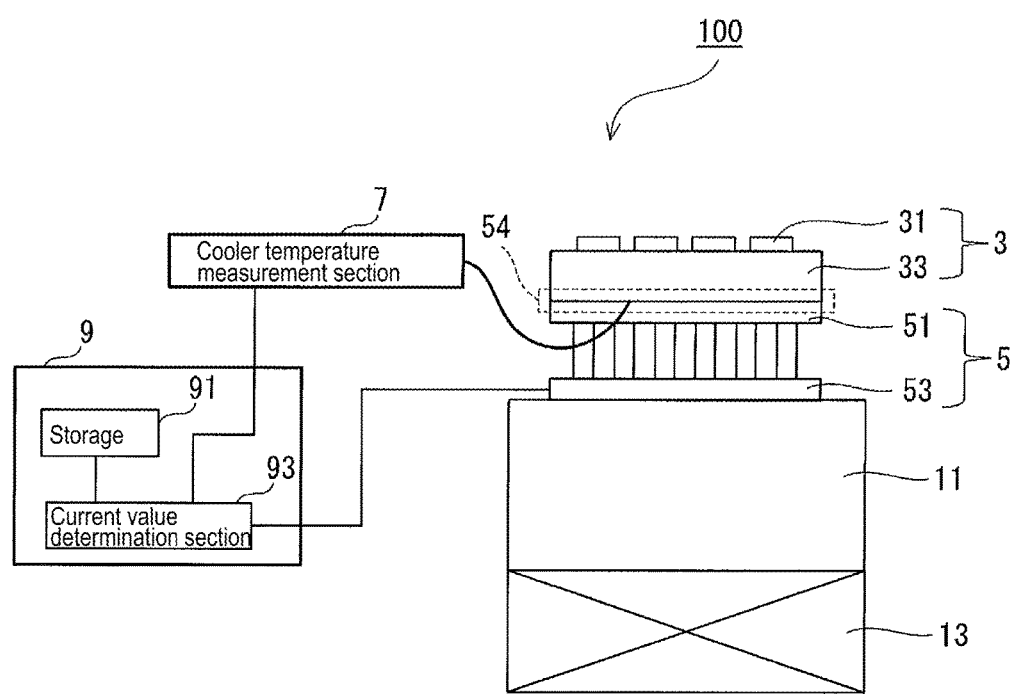
FIG. 4 is a diagram schematically showing a configuration of a laser light source device of a reference example.

Thus, the present inventor has examined the laser light source device 100 of the reference example as shown in FIG. 4. The laser light source device 100 of the reference example will be described with reference to FIG. 4. The laser light source device 100 of the reference example is different from the laser light source device 1 of the embodiment in that the element temperature measurement section 6 is not provided and in a configuration of a controller 9, and other configurations are similar to the case in the laser light source device 1. The laser light source device 100 of the reference example measures the temperature of the Peltier element 5 (cooler temperature, more specifically the temperature of the heat absorbing surface 54) and performs control such that the temperature of the Peltier element 5 approaches a predetermined set temperature.

The controller 9 includes a storage 91 and a current value determination section 93. As shown in FIG. 4(*b*), the storage 91 stores the set temperature (for example, 22° C.). The current value determination section 93 acquires the cooler temperature from the cooler temperature measurement section 7 and reads the set temperature from the storage 91. The current value determination section 93 supplies current to the Peltier element 5 such that the cooler temperature approaches the set temperature.

The present inventor has determined the set temperature to be stored in the storage 91 as follows. That is, the laser light source device 100 was set such that the light output was 100% (that is, the intensity is maximum) and operated to suitably change the set temperature of the Peltier element 5. Then, a set temperature at which the temperature of the semiconductor laser element 31 was stable in a desired range (for example, 23 to 25° C.) was found out and stored in the storage 91. As an example, when the set temperature was set to 22° C., the temperature of the semiconductor laser element 31 was stabilized at desired temperatures of 23 to 25° C., and therefore, the set temperature was set to 22° C.

Here, as a result of intensive studies made by the present inventor, it has been found that in the laser light source device 100 of the reference example, there occurs such a phenomenon that the temperature of the semiconductor laser element 31 is stabilized at a higher or lower temperature than a desired temperature (for example, 23 to 25° C.). This will be described in detail below.

When the laser light source device 100 of the reference example was set such that the light output was 100% and operated, the temperature of the semiconductor laser element 31 was stabilized at the desired temperatures of 23 to 25° C. However, when the light output was changed from 100% to 25%, the temperature of the semiconductor laser element 31 reached lower than the desired range (that is, 23 to 25° C.). This phenomenon is believed to be caused by the fact that in spite of the fact that heat generated from the semiconductor laser element 31 decreases due to the reduction in the light output to 25%, the set temperature is set to a constant value (that is, 22° C.) regardless of the light output, and therefore, the semiconductor laser element 31 is excessively cooled.

When a plurality of the laser light source devices 100 of the reference example were prepared and each of the laser light source devices 100 was set such that the light output was 100% and operated, in one of the laser light source devices 100, the temperature of the semiconductor laser element 31 reached higher than the desired temperatures of 23 to 25° C. In another laser light source device 100, the temperature of the semiconductor laser element 31 reached lower than the desired temperatures of 23 to 25° C. As described above, depending on the laser light source device 100, the temperature of the semiconductor laser element 31 reached higher or lower than the desired temperatures of 23 to 25° C. This phenomenon is believed to be caused by the strong influence of the individual difference of the semiconductor laser element 31 because the actual temperature of the semiconductor laser element 31 is not considered in the temperature control by the laser light source device 100 of the reference example.

(Operational Effects)

Hereinafter, operational effects of the laser light source device 1 of the present embodiment will be described.

According to the laser light source device 1 of the present embodiment, the temperature of the heat absorbing surface 54 of the Peltier element 5 is measured, and the temperature of the heat absorbing surface 54 is to be controlled. That is, the controller 8 is to control a temperature of a place closer to the Peltier element 5 than the semiconductor laser element 31. Consequently, the influence of the heat transfer portion 33 can be suppressed. That is, the controller 8 can realize highly accurate temperature control, as compared with the conventional technique of measuring the temperature of the semiconductor laser element 31 and controlling the temperature of the semiconductor laser element 31.

Further, according to the laser light source device 1 of the present embodiment, the set temperature is determined based on the temperature of the semiconductor laser element 31 (that is, the element temperature) (see FIG. 3), and control is performed such that the temperature of the Peltier element 5 (that is, the cooler temperature) approaches the set temperature (see FIG. 2). That is, it is possible to control the cooler temperature while considering an actual temperature of the semiconductor laser element. This makes it possible to stabilize the temperature of the semiconductor laser element 31 within a desired range while controlling the cooler temperature.

Particularly, according to the laser light source device 1 of the present embodiment, when the temperature of the semiconductor laser element 31 exceeds the allowable upper limit temperature (YES in S205 in FIG. 3), the set temperature is lowered (S213 in FIG. 3). When the temperature of the semiconductor laser element 31 falls below the allowable lower limit temperature (YES in S221 in FIG. 3), the set temperature is increased (S229 in FIG. 3). That is, the set temperature is adjusted to a suitable value in consideration of the actual temperature of the semiconductor laser element 31. This makes it possible to stabilize the temperature of the semiconductor laser element 31 within a desired range even when the light output from the laser light source device 1 is changed and the amount of heat generated from the semiconductor laser element 31 changes. In addition, it is possible to suppress the influence of the individual difference of the semiconductor laser element 31.

According to the laser light source device 1 of the present embodiment, the set temperature is changed when a state in which the element temperature exceeds the allowable upper limit temperature or a state in which the element temperature falls below the allowable lower limit temperature continues for a certain time (YES in S207 and YES in S223 in FIG. 3). Consequently, it is possible to suppress unnecessary change in the set temperature at a stage where the temperature of the semiconductor laser element 31 is not stabilized and temperature fluctuation is large. That is, according to the laser light source device 1 of the present embodiment, the set temperature can be suitably set based on the temperature of the semiconductor laser element 31.

Further, according to the laser light source device 1 of the present embodiment, the set temperature is not set to a value below the lower limit but set to be equal to or higher than the lower limit. Consequently, since the cooler temperature can be prevented from reaching extremely low temperatures, it is possible to suppress dirt such as rust and short circuit due to condensation on the Peltier element 5.

Further, according to the laser light source device 1 of the present embodiment, the set temperature of the cooler temperature is not set to a value exceeding the upper limit but set to be equal to or lower than the upper limit. Consequently, the element temperature of the semiconductor laser element 31 can be prevented from reaching extremely high temperatures, and it is possible to suppress shortening of the life of the semiconductor laser element 31.

Another Embodiment

It should be noted that the laser light source device is not limited to the configuration of the above-described embodiment, and of course, can be modified in various ways without departing from the spirit of the present invention. For example, it is, of course, possible to arbitrarily select configurations according to the following another embodiment and employ them in the configuration according to the above-described embodiments.

<1> In the present embodiment, although the element temperature measurement section 6 measures the temperature of the heat transfer portion 33 as the temperature of the semiconductor laser element 31, the element temperature measurement section 6 may directly measure the temperature of the semiconductor laser element 31, or may measure the temperature of an inner wall of a package of the light source unit 3. More generally, it suffices that the element temperature measurement section 6 measures a place having a temperature equivalent to that of the semiconductor laser element 31.

<2> In the present embodiment, although the cooler temperature measurement section 7 measures the temperature of the heat absorbing surface 54 in the heat absorbing portion 51 of the Peltier element 5, the cooler temperature measurement section 7 may measure the temperature of different places. For example, the cooler temperature measurement section 7 may measure the heat absorbing portion 51, or a metal plate may be provided between the heat transfer portion 33 and the heat absorbing portion 51, and the temperature of the metal plate may be measured.

<3> In the present embodiment, although the laser light source device 1 has the semiconductor laser element 31 that emits blue laser light having a wavelength of 380 to 500 nm, the present invention is not limited thereto. That is, the laser light source device 1 may have the semiconductor laser element 31 that emits laser light of different colors having different wavelengths. For example, the laser light source device 1 may have a semiconductor laser element that emits blue laser light having a wavelength of 380 to 500 nm, a semiconductor laser element that emits green laser light having a wavelength of 500 to 580 nm, and a semiconductor laser element that emits red laser light having a wavelength of 580 to 700 nm. In this case, these semiconductor laser elements may share the same Peltier element 5, or the semiconductor laser elements may be cooled by different Peltier elements 5 for each wavelength.

<4> In the present embodiment, although the processing in S207 and S211 is executed in the set temperature determination processing in FIG. 3, if it is determined that the element temperature exceeds the allowable upper limit temperature without executing this processing (S205: YES), the set temperature may be lowered (S213). Likewise, if it is determined that the element temperature falls below the allowable lower limit temperature without executing the processing in S223 and S227 (S221: YES), the set temperature may be increased (S229).

<5> In this embodiment, although the set temperature is increased/lowered by a predetermined amount in the set temperature determination processing in FIG. 3 (S213, S229), the set temperature may be changed stepwise. For example, the set temperature may be changed by 0.1° C. every time when the state in which the element temperature exceeds the allowable upper limit temperature or the state in which the element temperature falls below the allowable lower limit temperature continues for 10 seconds. The set temperature may be continuously changed.

<6> In the set temperature determination processing in FIG. 3, the timing of performing the processing in S203, S209, and S225 is not limited thereto. For example, S203 may be performed before S200. S209 may be executed at any timing as long as S209 is executed before S211. Similarly, S225 may be executed at any timing as long as S225 is executed before S227.

DESCRIPTION OF REFERENCE SIGNS

1 Light source device
3 Light source unit
31 Semiconductor laser element
33 Heat transfer portion
5 Peltier element
6 Element temperature measurement section
7 Cooler temperature measurement section
8 Controller
81 Storage
83 Set temperature determination section
85 Current value determination section

The invention claimed is:

1. A laser light source device comprising:
a light source unit including a semiconductor laser element that emits laser light having a predetermined wavelength band at a temperature from an allowable lower limit temperature to an allowable upper limit temperature;
a cooler connected to the light source unit;
an element temperature measurement section that measures an element temperature which is a temperature of the semiconductor laser element;
a cooler temperature measurement section that measures a cooler temperature which is a temperature of the cooler and is a temperature at a position away from the element temperature; and
a controller that controls the cooler,
wherein the controller controls the cooler such that the cooler temperature approaches a set temperature,
the controller lowers the set temperature as long as the element temperature exceeds the allowable upper limit temperature, and
the controller increases the set temperature as long as the element temperature falls below the allowable lower limit temperature.

2. The laser light source device according to claim 1,
wherein the controller lowers the set temperature as long as the element temperature exceeds the allowable upper limit temperature for a certain time, and
the controller maintains the set temperature when the element temperature does not exceed the allowable upper limit temperature for a certain time.

3. The laser light source device according to claim 1,
wherein the controller increases the set temperature as long as the element temperature falls below the allowable lower limit temperature for a certain time, and
the controller maintains the set temperature when the element temperature does not fall below the allowable lower limit temperature for a certain time.

4. The laser light source device according to claim 1,
wherein, when the element temperature exceeds the allowable upper limit temperature, and when the set temperature exceeds a lower limit, the controller lowers the set temperature, and when the element temperature exceeds the allowable upper limit temperature, and when the set temperature does not exceed the lower limit, the controller maintains the set temperature.

5. The laser light source device according to claim 1, wherein the controller comprises a storage that stores the allowable upper limit temperature and the allowable lower limit temperature, a set temperature determination section that compares the element temperature measured by the element temperature measurement section, with at least one of the allowable upper limit temperature and the allowable lower limit temperature to determine the set temperature, and a current value determination section that determines a current value to be supplied to the cooler based on a difference between the determined set temperature and the cooler temperature measured by the cooler temperature measurement section; and the cooler cools the light source unit according to current with the current value.

6. The laser light source device according to claim 2, wherein the controller increases the set temperature as long as the element temperature falls below the allowable lower limit temperature for a certain time, and the controller maintains the set temperature when the element temperature does not fall below the allowable lower limit temperature for a certain time.

7. The laser light source device according to claim 2, wherein, when the element temperature exceeds the allowable upper limit temperature, and when the set temperature exceeds a lower limit, the controller lowers the set temperature, and when the element temperature exceeds the allowable upper limit temperature, and when the set temperature does not exceed the lower limit, the controller maintains the set temperature.

8. The laser light source device according to claim 3, wherein, when the element temperature exceeds the allowable upper limit temperature, and when the set temperature exceeds a lower limit, the controller lowers the set temperature, and when the element temperature exceeds the allowable upper limit temperature, and when the set temperature does not exceed the lower limit, the controller maintains the set temperature.

9. The laser light source device according to claim 6, wherein, when the element temperature exceeds the allowable upper limit temperature, and when the set temperature exceeds a lower limit, the controller lowers the set temperature, and when the element temperature exceeds the allowable upper limit temperature, and when the set temperature does not exceed the lower limit, the controller maintains the set temperature.

10. The laser light source device according to claim 2, wherein the controller comprises a storage that stores the allowable upper limit temperature and the allowable lower limit temperature, a set temperature determination section that compares the element temperature measured by the element temperature measurement section, with at least one of the allowable upper limit temperature and the allowable lower limit temperature to determine the set temperature, and a current value determination section that determines a current value to be supplied to the cooler based on a difference between the determined set temperature and the cooler temperature measured by the cooler temperature measurement section; and the cooler cools the light source unit according to current with the current value.

11. The laser light source device according to claim 3, wherein the controller comprises a storage that stores the allowable upper limit temperature and the allowable lower limit temperature, a set temperature determination section that compares the element temperature measured by the element temperature measurement section, with at least one of the allowable upper limit temperature and the allowable lower limit temperature to determine the set temperature, and a current value determination section that determines a current value to be supplied to the cooler based on a difference between the determined set temperature and the cooler temperature measured by the cooler temperature measurement section; and the cooler cools the light source unit according to current with the current value.

12. The laser light source device according to claim 4, wherein the controller comprises a storage that stores the allowable upper limit temperature and the allowable lower limit temperature, a set temperature determination section that compares the element temperature measured by the element temperature measurement section, with at least one of the allowable upper limit temperature and the allowable lower limit temperature to determine the set temperature, and a current value determination section that determines a current value to be supplied to the cooler based on a difference between the determined set temperature and the cooler temperature measured by the cooler temperature measurement section; and the cooler cools the light source unit according to current with the current value.

13. The laser light source device according to claim 6, wherein the controller comprises a storage that stores the allowable upper limit temperature and the allowable lower limit temperature, a set temperature determination section that compares the element temperature measured by the element temperature measurement section, with at least one of the allowable upper limit temperature and the allowable lower limit temperature to determine the set temperature, and a current value determination section that determines a current value to be supplied to the cooler based on a difference between the determined set temperature and the cooler temperature measured by the cooler temperature measurement section; and the cooler cools the light source unit according to current with the current value.

14. The laser light source device according to claim 7, wherein the controller comprises a storage that stores the allowable upper limit temperature and the allowable lower limit temperature, a set temperature determination section that compares the element temperature measured by the element temperature measurement section, with at least one of the allowable upper limit temperature and the allowable lower limit temperature to determine the set temperature, and a current value determination section that determines a current value to be supplied to the cooler based on a difference between the determined set temperature and the cooler temperature measured by the cooler temperature measurement section; and the cooler cools the light source unit according to current with the current value.

15. The laser light source device according to claim 8, wherein the controller comprises a storage that stores the allowable upper limit temperature and the allowable lower limit temperature, a set temperature determination section that compares the element temperature measured by the element temperature measurement section, with at least one of the allowable upper limit temperature and the allowable lower limit temperature to determine the set temperature, and a current value determination section that determines a current value to be supplied to the cooler based on a difference between the determined set temperature and the cooler temperature measured by the cooler temperature measurement section; and the cooler cools the light source unit according to current with the current value.

16. The laser light source device according to claim 9, wherein the controller comprises a storage that stores the allowable upper limit temperature and the allowable lower limit temperature, a set temperature determination section that compares the element temperature measured by the element temperature measurement section, with at least one of the allowable upper limit temperature and the allowable lower limit temperature to determine the set temperature, and a current value determination section that determines a current value to be supplied to the cooler based on a difference between the determined set temperature and the cooler temperature measured by the cooler temperature measurement section; and the cooler cools the light source unit according to current with the current value.

\* \* \* \* \*